United States Patent
Atris et al.

(10) Patent No.: US 7,289,052 B1
(45) Date of Patent: Oct. 30, 2007

(54) SYSTEM AND METHOD FOR ANALOG-TO-DIGITAL CONVERSION

(75) Inventors: Youssef H. Atris, Gilbert, AZ (US); Brandt Braswell, Chandler, AZ (US); Douglas A. Garrity, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/411,352

(22) Filed: Apr. 25, 2006

(51) Int. Cl.
    *H03M 1/12* (2006.01)
(52) U.S. Cl. ...................... 341/155; 341/122
(58) Field of Classification Search ............... 341/155, 341/122, 172, 144, 118, 120, 163, 161
    See application file for complete search history.

(56) References Cited

U.S. PATENT DOCUMENTS

| | | | |
|---|---|---|---|
| 3,982,241 A * | 9/1976 | Lipcon | 341/118 |
| 5,805,467 A * | 9/1998 | Richards | 702/101 |
| 6,016,115 A | 1/2000 | Heubi | 341/161 |
| 6,388,589 B1 * | 5/2002 | Arai | 341/78 |
| 6,909,393 B2 * | 6/2005 | Atriss et al. | 341/163 |
| 7,126,423 B1 * | 10/2006 | Kruiskamp | 330/253 |

OTHER PUBLICATIONS

Staszewski et al., "All-digital TX frequency synthesizer and discrete-time receiver for Bluetooth radio in 130-nm CMOS," IEEE Journal of Solid State Circuits, vol. 39, No. 12, Dec. 12, 2004, pp. 2278-2291.

* cited by examiner

*Primary Examiner*—Peguy JeanPierre
(74) *Attorney, Agent, or Firm*—Ingrassia Fisher Lorenz

(57) ABSTRACT

A system and method for converting an analog signal to a digital signal is provided including a first circuit (22) having a signal range and an input for receiving a first signal, and a second circuit (24) having an input receiving the analog signal and a first output coupled to the input of the first circuit. The first circuit (22) includes an amplifier (28). The first circuit (22) samples the first signal and produces the digital signal from the first signal using the amplifier. A second output of the second circuit (24) is coupled to the amplifier (28). The second circuit (24) samples and scales the analog signal via the amplifier (28) to produce the first signal within the signal range and cancels an offset of the first signal. The system and method reduce power consumption and save device area.

20 Claims, 6 Drawing Sheets

SYSTEM AND METHOD FOR ANALOG-TO-DIGITAL CONVERSION

FIELD OF THE INVENTION

The present invention generally relates to signal conversion, and more particularly relates to a circuit and method for converting an analog signal to a digital signal.

BACKGROUND OF THE INVENTION

When processing information in electronic devices, the information may originate in some analog form (e.g., as an analog signal), and analog-to-digital converter (ADC) systems are typically used to transform the analog signal into a digital signal for further processing. A conventional ADC system usually includes a core circuit that performs the analog-to-digital conversion and additional support circuitry coupled to the core circuit. Examples of the additional support circuitry include, but are not necessarily limited to, a reference circuit that sets the full-scale range of the core circuit and a scaling circuit that scales the analog input signals to fit into the full-scale operating range of the core circuit.

Most conventional ADC systems, such as one based on a redundant signed digit (RSD) cyclic system and the like, have separate circuit blocks for each of these functions (e.g., scaling and setting the full-scale range). In general, each of these circuit blocks includes an operational amplifier (OPAMP) in the respective circuit. When using an OPAMP, an offset error may be associated with the differential inputs of the OPAMP. The impact of this offset error is increased in conventional ADC systems using multiple OPAMPs to accomplish the analog-to-digital conversion. For example, the offset error associated with the OPAMP for the reference circuit, the offset error associated with the OPAMP for the scaling circuit, and the offset error associated with the OPAMP for the core converter circuit together contribute to the overall error of the ADC system. In some instances, the circuit blocks may be designed to minimize the offset error attributed to the OPAMPs but at the cost of increasing the complexity of the circuit block.

In addition to contributing offset error to the ADC system, the OPAMPs consume power during normal operation of the ADC system and occupy space. In portable devices, such as cellular phones, personal digital assistants, and the like, minimizing power consumption and device size are valuable design considerations. For example, mobile communication products place a premium on maximizing battery life.

Accordingly, a system for converting an analog signal to a digital signal having reduced power consumption and component size is desired. In addition, a system for converting an analog signal to a digital signal having reduced offset errors is desired. In addition, a method for converting an analog signal to a digital signal having reduced power consumption and component size is desired. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description.

According to various embodiments, a system is provided for converting an analog signal to a digital signal comprising a comparator, an Analog-to-Digital Converter (ADC) core circuit coupled to the comparator and having an operational amplifier (OPAMP), and a scaling circuit coupled to the ADC core circuit. The scaling circuit samples and scales the analog signal, via the OPAMP, to produce a scaled signal within an operating range of the ADC core circuit. The ADC core circuit samples the scaled signal supplied by the scaling circuit and applies a gain to the samples of the scaled signal, via the OPAMP, in response to control signals from the comparator. The comparator determines a most significant bit (MSB) and subsequent bits, corresponding to a digital representation of the analog signal, based on the samples of the scaled signal, and generates the control signals based on these bit determinations. The gain is derived from a reference signal in response to the control signals from the comparator. The system may additionally include a reference circuit coupled to the ADC core circuit that samples a reference potential to produce the reference signal via the OPAMP. Using proper switch timing of each of the ADC core circuit and scaling circuit, and optionally the reference circuit, these circuits together share one amplifier during the conversion of the analog signal to the digital signal.

Figure 1:
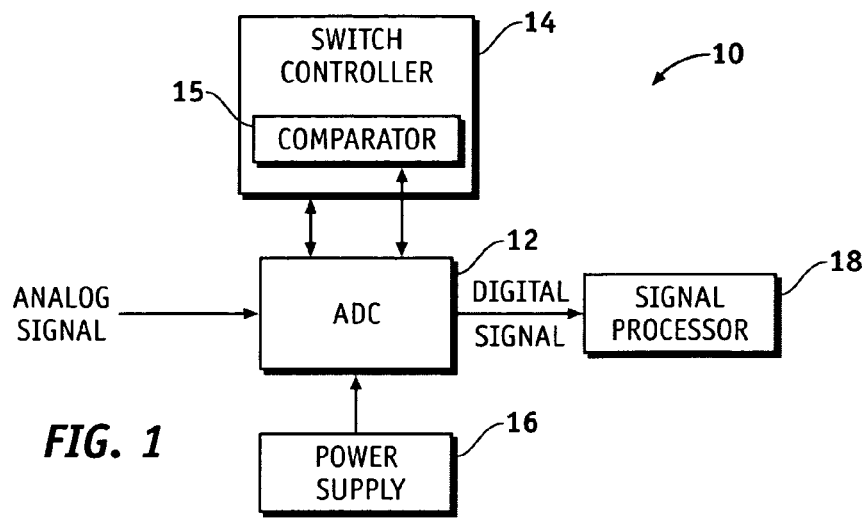
FIG. 1 is a block diagram illustrating portions of a system for converting an analog signal to a digital signal in accordance with an exemplary embodiment of the present invention.

Referring to the drawings, FIG. 1 is a block diagram illustrating portions of a system 10 for converting an analog signal to a digital signal according to an exemplary embodiment of the present invention. System 10 comprises an analog-to-digital converter (ADC) system 12, a processor 18 (e.g., signal processor, controller, or other type of processor) coupled to an output of ADC system 12, a power supply 16 coupled to ADC system 12, and a switch controller 14 coupled to ADC system 12. Although each of these components is described as a separate component in system 10, one or more of the components may be combined with other components of the system 10. For example, switch controller 14 may be incorporated with ADC system 12. ADC system 12 is configured to receive an analog signal, sample the analog signal, and convert the analog signal to a digital signal for further processing by signal processor 18. Power supply 16 provides one or more reference potentials (e.g., a battery voltage or system voltages) to ADC system 12. ADC system 12 supplies the sampled analog signals to switch controller 14. Switch controller 14 includes a comparator 15 that compares the sampled signals with pre-determined values and generates bits based on these comparisons. Comparator 15 may alternatively be a separate circuit from switch controller 14. Switch controller 14 generates control signals from these comparisons and transmits the control signals to ADC system 12. In response to the control signals, ADC system 12 activates/deactivates various switches in ADC system 12 to produce the sampled signals. System 10 may be implemented in a variety of electronic devices that incorporate one or more components utilizing digital processing, such as automobiles, industrial applications, portable electronic devices, wireless communication devices, computer systems, and the like.

Figure 2:
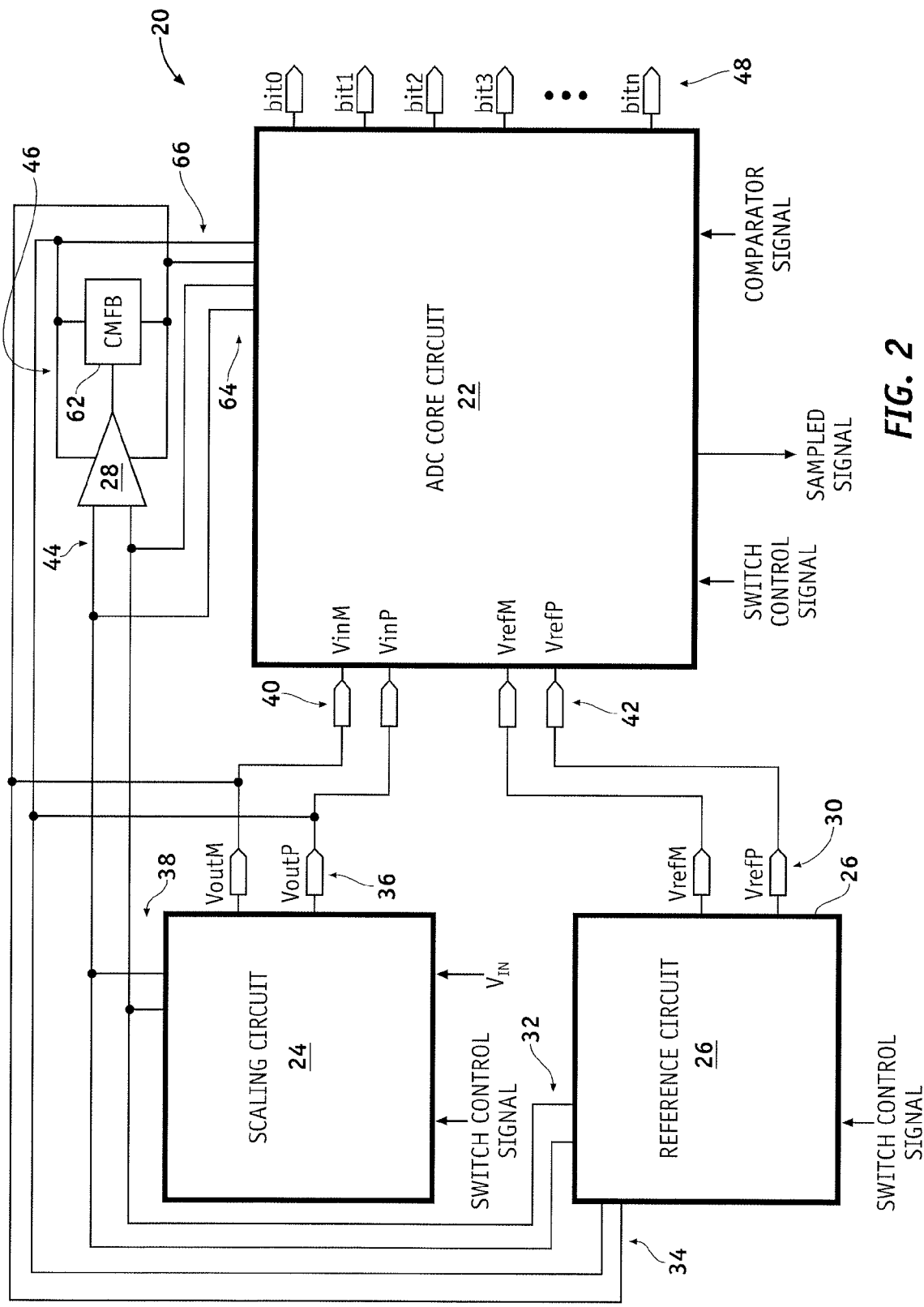
FIG. 2 is a block diagram of the ADC system shown in FIG. 1 in accordance with an exemplary embodiment of the present invention.

FIG. 2 is a block diagram of an ADC system 20, such as ADC system 12 shown in FIG. 1, according to an exemplary embodiment of the present invention. ADC system 20 comprises an ADC core circuit 22 having first and second inputs 42, 40, a reference circuit 26 having a first output 30 coupled to input 42 of ADC core circuit 22, a scaling circuit 24 having a first output 36 coupled to input 40 of ADC core circuit 22, and an amplifier 28 (e.g., an operational amplifier (OPAMP)) having an input 44 and an output 46. Although OPAMP 28 is described as a separate component of ADC system 20, OPAMP 28 may be incorporated with any one of ADC core circuit 22, reference circuit 26, and scaling circuit 24. Reference circuit 26 has a second output 32 coupled to input 44 of OPAMP 28 and an input 34 coupled to output 46 of OPAMP 28. Scaling circuit 24 has a second output 38 coupled to input 44 of amplifier 28. Input 44 and output 46 of amplifier 28 are coupled to additional circuit elements of ADC core circuit 22 via connections 64 and 66, respectively. In this exemplary embodiment, OPAMP 28 is shown as a separate component (e.g., outside of ADC core circuit 22) to better illustrate the shared use of OPAMP 28 in ADC system 20 by ADC core circuit 22, reference circuit 26, and scaling circuit 24.

Reference circuit 26 produces a reference signal (e.g., differential reference potentials (VrefM and VrefP)) at output 30, via OPAMP 28, and cancels an offset that may be produced at output 46 of OPAMP 28 when producing the reference signal. Reference circuit 26 may produce the reference signal by sampling a stable reference potential (e.g., a band-gap potential (Vbg)), such as may be supplied by power supply 16. Scaling circuit 24 samples and scales the analog signal to produce a scaled signal (e.g., VoutM and VoutP), via OPAMP 28, within a predetermined full-scale range of ADC core circuit 22 and supplies the scaled signal to ADC core circuit 22. ADC core circuit 22 samples the scaled signal to convert the analog signal to an equivalent digital signal. In an exemplary embodiment, samples of the scaled signal are supplied by ADC core circuit 22 to switch controller 14, and switch controller 14 produces signals (e.g., via comparator 15), corresponding to the samples of the scaled signal, that indicate a corresponding bit determination from the samples of the scaled signal. These signals are supplied back to ADC core circuit 22 to produce the bit representations at an output 48 of ADC core circuit 22 via one or more output ports (e.g., bit 0, bit 1, bit 2, . . . , bit n). ADC core circuit 22 may further comprise a common mode feedback (CMFB) circuit 62 coupled across output 46 of amplifier 28 to stabilize the common-mode voltages of amplifier 28 by adjusting the common-mode output voltages thereof.

In this exemplary embodiment, each of reference circuit 26, scaling circuit 24, and ADC core circuit 22 utilizes OPAMP 28 to accomplish their respective functions, and switch controller 14 manages the use of OPAMP 28 by a particular circuit via the control signals. For example, switch controller 14 supplies a first control signal to reference circuit 26 that activates reference circuit 26 to sample the reference potential (e.g., Vbg), provide the sampled reference potential to OPAMP 28, and perform offset cancellation on the resulting output signal from OPAMP 28. This output signal from OPAMP 28, without offset, that is derived from the sampled reference potential is the reference signal. Switch controller 14 supplies a second control signal to scaling circuit 24 that activates scaling circuit 24 to sample the analog signal, provide the sampled analog signal to OPAMP 28, and scale and perform offset cancellation on the resulting output signal from OPAMP 28. This output signal from OPAMP 28, without offset, that is derived from the sampled analog signal is the scaled signal (i.e., within the full-scale range of ADC core circuit 22). In this example, the timing of each of the first and second control signals is established by switch controller 14 such that each of the reference circuit 26 and scaling circuit 24 operate with OPAMP 28 during separate periods. Subsequently, switch controller 14 supplies a third control signal to ADC core circuit 22 to convert the scaled signal to an equivalent digital signal, such as using a conversion method based on a gain by two (2) plus/minus a predetermined potential (e.g., Vref). Although the gain by 2 plus/minus Vref conversion is described with ADC system 20, a variety of analog signal to digital signal conversion techniques may be used in ADC core circuit 22 while retaining a single amplifier architecture. Using a single amplifier in ADC system 20 reduces power consumption and offset error generation and minimizes the area occupied by ADC system 20.

Figure 3:
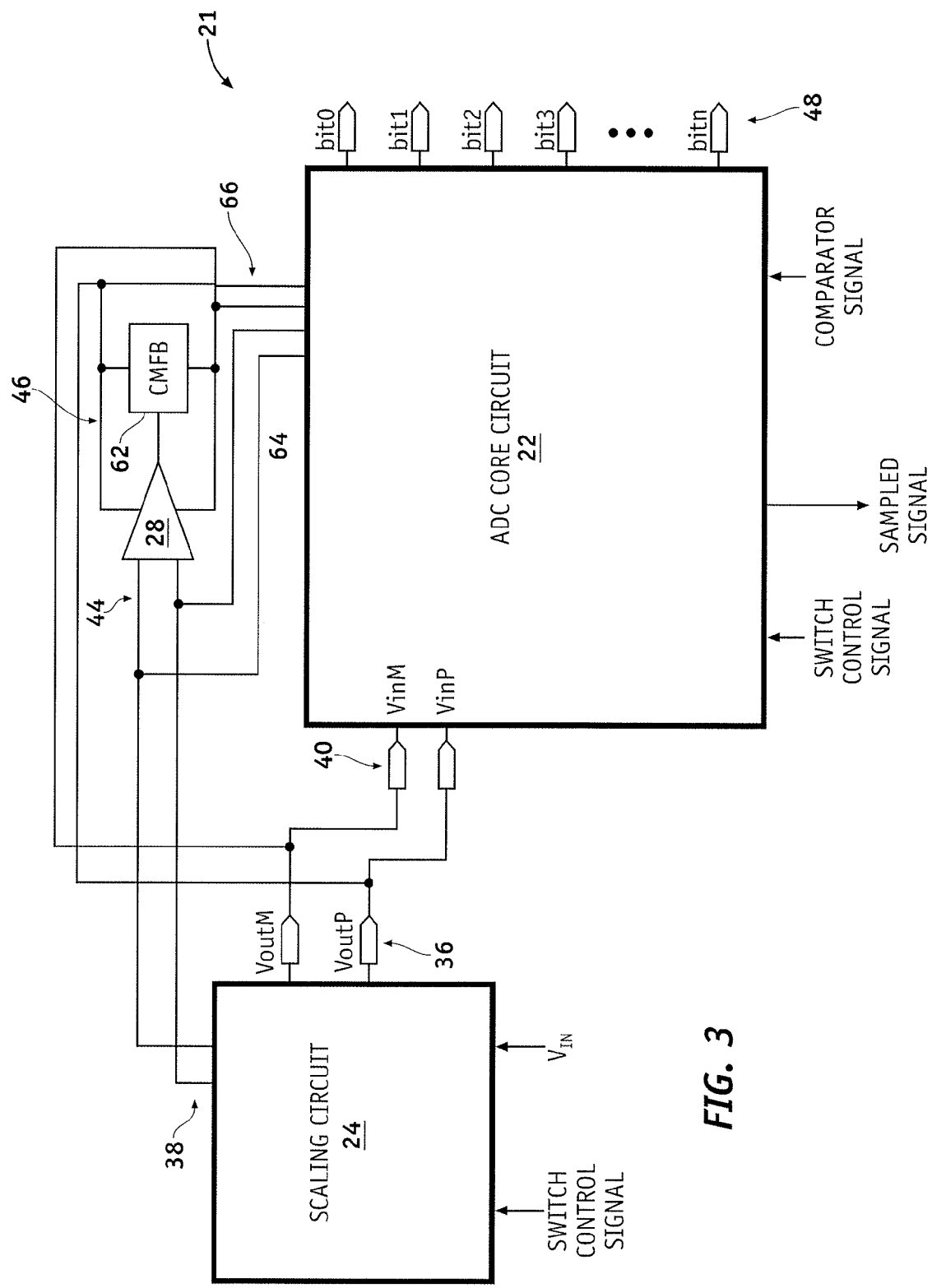
FIG. 3 is a block diagram of the ADC system shown in FIG. 1 according to another exemplary embodiment of the present invention.

FIG. 3 is a block diagram of an ADC system 21, such as ADC system 12, according to another exemplary embodiment of the present invention. ADC system 21 comprises ADC core circuit 22 having input 40 and scaling circuit 24 having output 36 coupled to input 40 of ADC core circuit 22 while excluding a dedicated reference circuit. In this exemplary embodiment, input 44 of OPAMP 28 is coupled to output 38 of scaling circuit 24, and output 46 of OPAMP 28 is coupled to output 36 of scaling circuit 24. ADC core circuit 22 produces the reference signal without using a dedicated reference circuit, such as reference circuit 26 shown in FIG. 2. In this exemplary embodiment, OPAMP 28 is shown outside of ADC core circuit 22 to better illustrate the shared use of OPAMP 28 in ADC system 21 by ADC core circuit 22 and scaling circuit 24. Using a single amplifier in ADC system 21 reduces power consumption and minimizes the area occupied by ADC system 21. By excluding reference circuit 26 and integrating the function of supplying reference potentials (VrefM and VrefP) into ADC core circuit 22, ADC system 21 further reduces power consumption and the area occupied by ADC system 21.

Figure 4:
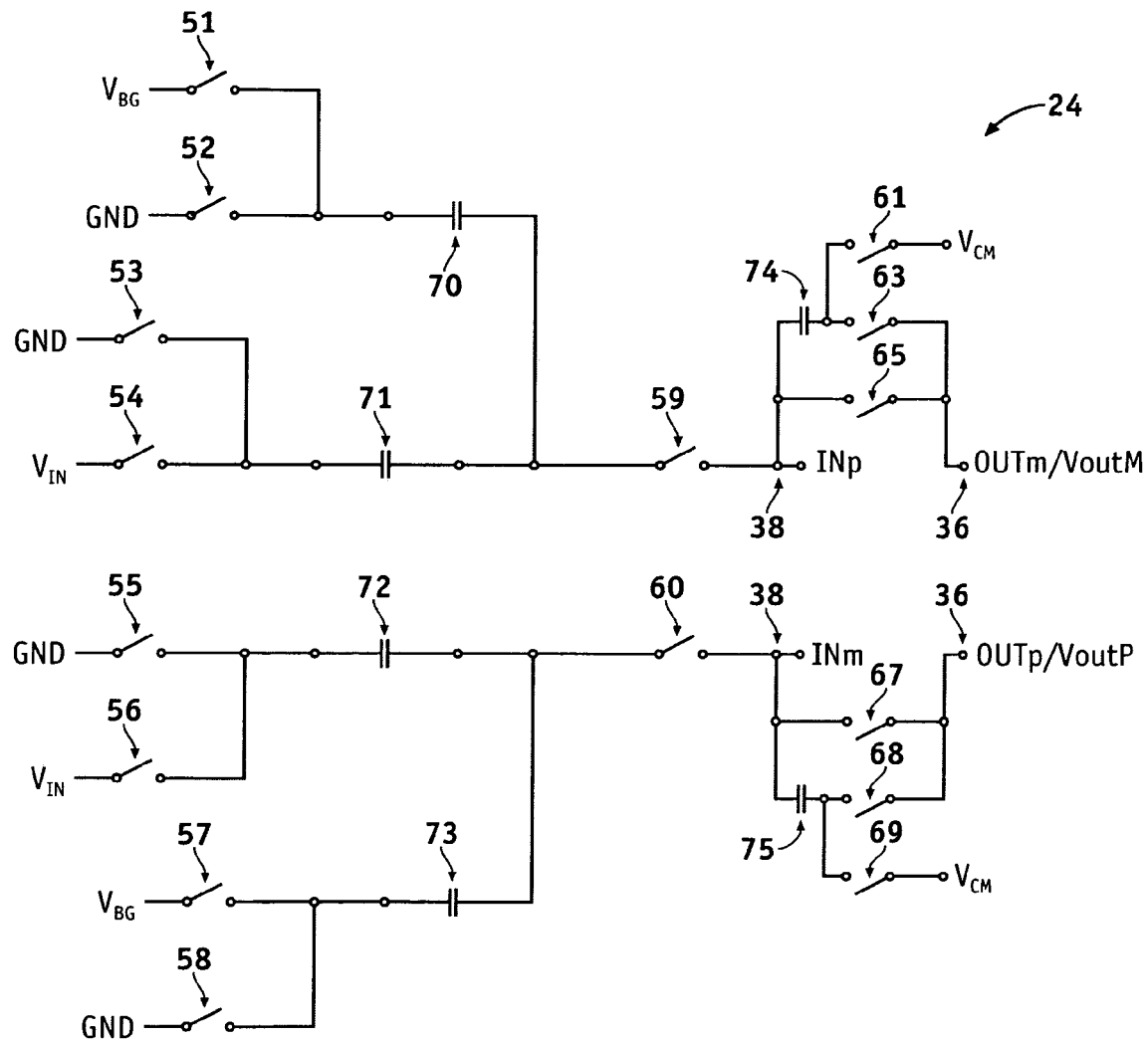
FIG. 4 is a circuit diagram of the scaling circuit shown in FIG. 3 in accordance with an exemplary embodiment.

FIG. 4 is a circuit diagram of the scaling circuit 24 shown in FIGS. 2 and 3, in accordance with an exemplary embodiment. Scaling circuit 24 comprises a first switched capacitor network 70, 71, 72, 73, switches 59 and 60 having a first terminal coupled to the first switched capacitor network 70, 71, 72, 73 and having a second terminal coupled to output 38 of scaling circuit 24, a second switched capacitor network 74, 75 coupled between output 38 and output 36 of scaling circuit 24, and switches 65 and 67 coupled between output 38 and output 36 of scaling circuit 24. The first switched capacitor network 70, 71, 72, 73 also includes switches 51 and 52 coupled to capacitor 70, switches 53 and 54 coupled to capacitor 71, switches 55 and 56 coupled to capacitor 72, and switches 57 and 58 coupled to capacitor 73. The second switched capacitor network 74, 75 also includes switches 61 and 63 coupled to capacitor 74, and switches 68 and 69 coupled to capacitor 75. Switches 51-61, 63, 65, and 67-69 are controlled by switch controller 14 shown in FIG. 1 via switch control signals. Outputs 38 and 36 of scaling circuit 24 are coupled to input 44 and output 46 of OPAMP 28, respectively. The scaling circuit 24 substantially instantaneously samples and scales the analog signal (e.g., Vin). The first switched capacitor network 70, 71, 72, 73 samples the analog signal, and the sampled signal is supplied to input 44 (e.g., $IN_P$ and $IN_M$) of OPAMP 28, which is coupled to output 38 of scaling circuit 24, for scaling with second switched capacitor network 74, 75. The scaled signal (e.g., VoutM and VoutP) is produced at output 46 (e.g., $OUT_M$ and $OUT_P$) of OPAMP 28 which is coupled to output 36 of scaling circuit 24 and also coupled to input 40 of ADC core circuit 22. The second switched capacitor network 74, 75 also cancels any offset that may appear at input 44 of OPAMP 28.

The first switched capacitor network 70, 71, 72, 73 comprises two pairs of two-phase switched capacitors 70, 71 and 72, 73. Each pair of two-phase switched capacitors 70, 71 and 72, 73 selectively couples to one of an input potential (Vin) and a band-gap potential (Vbg) during a first phase and to a reference potential (e.g., ground) during a second phase based on a pre-determined switching sequence as controlled by switch controller 14. In an exemplary embodiment, a first pair of two-phase switched capacitors comprises capacitors 70 and 71 that each have a first electrode coupled to output 38 via a switch 59, and a second pair of two-phase switched capacitors comprises capacitors 72 and 73 that each have a first electrode coupled to output 36 via a switch 60. When switches 59 and 60 close, capacitors 70, 71, 72, 73 are coupled to input 44 (e.g., $IN_P$ and $IN_M$) of OPAMP 28 via output 38 of scaling circuit 24. A second electrode of capacitor 70 is coupled to the band-gap potential (Vbg) and the reference potential (e.g., ground) via switches 51 and 52, respectively, a second electrode of capacitor 71 is coupled to the reference potential (e.g., ground) and the input potential (Vin) via switches 53 and 54, respectively. A second electrode of capacitor 72 is coupled to the reference potential (e.g., ground) and the input potential (Vin) via switches 55 and 56, respectively, and a second electrode of capacitor 73 is coupled to the band-gap potential (Vbg) and the reference potential (e.g., ground) via switches 57 and 58, respectively.

In an exemplary embodiment, the second switched capacitor network 74, 75 comprises a first feedback capacitor 74 having a first electrode coupled to input 44 (e.g., $IN_P$) of OPAMP 28 via output 38 of scaling circuit 24, a second feedback capacitor 75 having a first electrode coupled to input 44 (e.g., $IN_M$) of OPAMP 28 via output 38 of scaling circuit 24, switch 63 coupled between a second electrode of feedback capacitor 74 and output 46 (e.g., $OUT_M$) of OPAMP 28 via output 36 of scaling circuit 24, switch 68 coupled between a second electrode of feedback capacitor 75 and output 46 (e.g., $OUT_P$) of OPAMP 28 via output 36 of scaling circuit 24, switch 61 coupled between the second electrode of feedback capacitor 74 and a reference potential (e.g., a common-mode potential ($V_{CM}$)), switch 69 coupled between the second electrode of feedback capacitor 75 and the reference potential (e.g., a common-mode potential ($V_{CM}$)), and switch 67 coupled between the second electrode of feedback capacitor 75 and the reference potential ($V_{CM}$). Additionally, switches 65 and 67 are coupled between output 38 and output 36. Using a switched capacitor topology more readily achieves offset cancellation that, if unperformed, would generally degrade the accuracy of any sensed voltage by OPAMP 28.

The first and second switched capacitor networks operate in response to the switch control signals from switch controller 14 having timing phases to open and close switches for autozeroing, sampling, and scaling the analog signal. Switches 52, 54, 55, and 57 of the first switched capacitor network and switches 61, 65, 67, and 69 of the second switched capacitor network operate together to autozero scaling circuit 24 and sample the analog signal during an autozero phase. During a scaling phase, switches 51, 53, 56, 58, 59, and 60 of the first switched capacitor network and switches 63 and 68 of the second switched capacitor network operate together to scale the sampled analog signal and capture offset voltages that may appear at input 44 of OPAMP 28.

Figure 5:
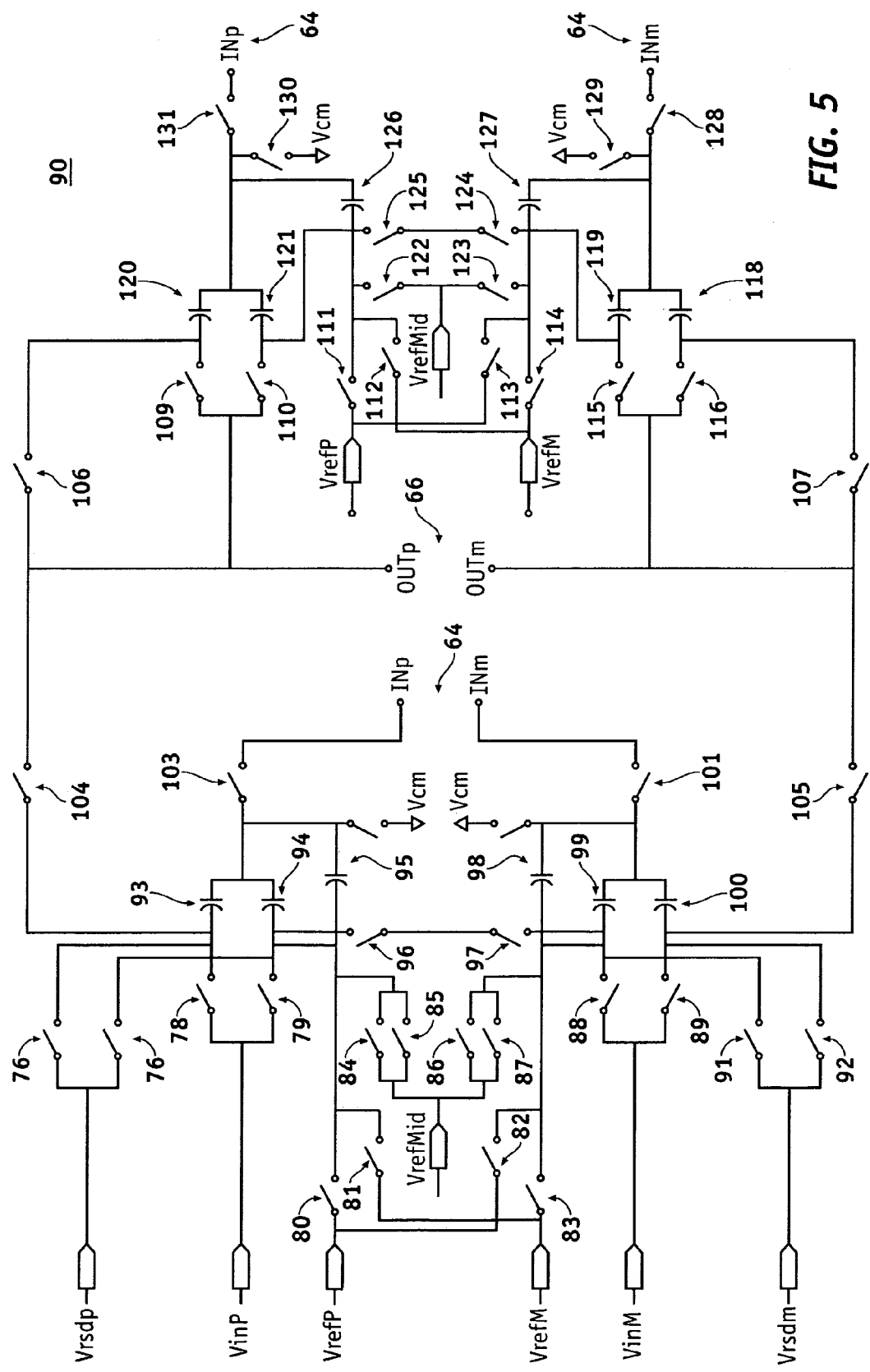
FIG. 5 is a circuit diagram of a portion of the converter core circuit shown in FIG. 3 in accordance with an exemplary embodiment.

FIG. 5 is a circuit diagram of a conversion circuit 90 of ADC core circuit 22 shown in FIGS. 2 and 3, in accordance with an exemplary embodiment. In addition of OPAMP 28, which is omitted from FIG. 5 for simplicity of presentation, conversion circuit 90 of ADC core circuit 22 comprises a first switched capacitor network having an output 64 coupled to input 44 (e.g., via $IN_P$ and $IN_M$) of OPAMP 28, and a second switched capacitor network having an input 66 coupled to output 46 (e.g., via $OUT_M$ and $OUT_P$) of OPAMP 28 and sharing output 64 with the first switched capacitor network. Each of the first and second switched capacitor networks also has an input configured to selectively couple to input potentials (e.g., VinP and VinM), such as supplied by scaling circuit 24, and residue potentials (VrsdP and VrsdM), such as supplied by switch controller 14. Switch controller 14 provides control signals to all of the switches of conversion portion 90 to perform the analog-to-digital signal conversion, although one or more other controllers may provide switching signals to the switches of conversion portion 90. Each of the control signals has a pre-determined timing phase.

First switched capacitor network comprises first and second pairs of switched capacitors 93, 94 and 99, 100 and switches 76, 77, 78, 79, 88, 89, 91, 92, 96, 97, 101, 102, 103, 104, 105, and 135. Each of capacitors 93 and 94 has a first electrode selectively coupled to the input potential (VinP) via switches 78 and 79, respectively, to a comparator potential (VrsdP) (e.g., from comparator 15) via switches 76 and 77, respectively, and to output 46 (e.g., via $OUT_P$) of OPAMP 28 via switch 104. A second electrode of each of capacitors 93 and 94 is selectively coupled to input 44 (e.g., via $IN_P$) of OPAMP 28 via switch 103 and to a reference potential (e.g., the common-mode potential (Vcm)) via switch 102. Each of capacitors 99 and 100 has a first electrode selectively coupled to the input potential (VinM) via switches 88 and 89, respectively, to the residue potential (VrsdM) via switches 91 and 92, respectively, and to output 46 (e.g., via $OUT_M$) of OPAMP 28 via switch 105. A second electrode of each of capacitors 99 and 100 is selectively coupled to input 44 (e.g., via $IN_M$) of OPAMP 28 via switch 101 and to the reference potential (Vcm) via switch 135. The first electrode of capacitor 94 is further coupled to the first electrode of capacitor 99 via switches 96 and 97. Switches 78, 79 and 88, 89 operate together during a timing phase for sampling the scaled signal supplied from scaling circuit 24 (e.g., VinP and VinM, respectively). During this sampling of the scaled signal, comparator 15 in switch controller 14 determines a most significant bit (MSB) from this sampled signal. Switches 96, 97, 104, and 105 operate together during a timing phase for sampling the output signal provided at output 46 of OPAMP 28 as a result of sampling by the second switched capacitor network.

In addition, the first switched capacitor network includes, but is not necessarily limited to, a reference capacitor network. The reference capacitor network comprises first and second capacitors 95 and 98 and switches 80, 81, 82, 83, 84, 85, 86, 87, 102, and 135. Capacitor 95 has a first electrode selectively coupled to a first reference potential (e.g., VrefP) via switch 80, to a second reference potential (e.g., VrefM) via switch 81, and to a third reference potential (e.g., VrefMid) via switches 84 and 85. A second electrode of capacitor 95 is coupled to the reference potential (Vcm) via switch 102. Capacitor 98 has a first electrode selectively coupled to the first reference potential (VrefP) via switch 82, to the second reference potential (VrefM) via switch 83, and to the third reference potential (VrefMid) via switches 86 and 87. A second electrode of capacitor 98 is coupled to the reference potential (Vcm) via switch 135. Switches 80, 81, 82, 83, 84, 85, 86, and 87 operate together during a timing phase for producing and sampling a pre-determined gain potential (e.g., +Vref, −Vref, and zero volts (0V)). This gain potential is based on the particular analog-to-digital conversion technique implemented in conversion circuit 90. In this exemplary embodiment, the gain potential is selected to apply, to the signal by capacitors 93, 94, 99, and 100, one of a gain by two (2), a gain by two (2) plus Vref, and a gain by two (2) minus Vref. The gain potential is sampled by capacitors 95 and 98 during this timing phase. Switches 101 and 103 operate together to provide the sampled signal and the sampled gain potential to input 44 of OPAMP 28.

Second switched capacitor network comprises first and second pairs of switched capacitors 120, 121 and 119, 118, and switches 106, 107, 109, 110, 115, 116, 129, 130, 131, and 129. Each of capacitors 120 and 121 has a first electrode selectively coupled to the residue potential (VrsdP) via switch 106 and to output 46 (e.g., via $OUT_P$) of OPAMP 28 via switches 109 and 110, respectively. A second electrode of each of capacitors 120 and 121 is selectively coupled to input 44 (e.g., via $IN_P$) of OPAMP 28 via switch 131 and to the reference potential (e.g., the common-mode potential (Vcm)) via switch 130. Each of capacitors 119 and 118 has a first electrode selectively coupled to the input potential ($OUT_M$) via switches 115 and 116, respectively, to the residue potential (VrsdM) via switches 107 and to output 46 (e.g., via $OUT_M$) of OPAMP 28 via switches 115 and 116, respectively. A second electrode of each of capacitors 119 and 118 is selectively coupled to input 44 (e.g., via $IN_M$) of OPAMP 28 via switch 128 and to the reference potential (e.g., the common-mode potential (Vcm)) via switch 129. The first electrode of capacitor 121 is further coupled to the first electrode of capacitor 119 via switches 124 and 125. Switches 109, 110 and 115, 116 operate together during a timing phase for sampling the output signal at the output 46 of OPAMP 28 (e.g., via $OUT_P$ and $OUT_M$, respectively) as a result of sampling by the first switched capacitor network. During this sampling of the scaled signal, comparator 15 in switch controller 14 determines a next bit from this sampled signal.

In addition, the second switched capacitor network includes, but is not necessarily limited to, a reference capacitor network. The reference capacitor network comprises first and second capacitors 126 and 127 and switches 111, 112, 113, 114, 122, 123, 124, 125, 129, and 130. Capacitor 126 has a first electrode selectively coupled to the first reference potential (VrefP) via switch 111, to the second reference potential (VrefM) via switch 112, and to the third reference potential (VrefMid) via switch 122. A second electrode of capacitor 126 is coupled to the reference potential (Vcm) via switch 130. Capacitor 127 has a first electrode selectively coupled to the first reference potential (VrefP) via switch 113, to the second reference potential (VrefM) via switch 114, and to the third reference potential (VrefMid) via switch 123. A second electrode of capacitor 127 is coupled to the reference potential (Vcm) via switch 129. Switches 111, 112, 113, 114, 122, and 123 operate together during a timing phase for producing a pre-determined gain potential (e.g., +Vref, −Vref, and zero volts (0V)). This gain potential is also based on the particular analog-to-digital conversion technique and selected based on a determination by comparator 15 of switch controller 14 of the next bit. In this exemplary embodiment, the gain potential is selected to apply, to the signal sampled by capacitors 120, 121, 119, and 118, one of a gain by two (2), a gain by two (2) plus Vref, and a gain by two (2) minus Vref. The pre-determined gain potential is sampled by capacitors 126 and 127 during this phase.

In general operation, the analog signal is sampled and properly scaled, while performing offset cancellation, by scaling circuit 24 to produce a first signal (e.g., supplied at VinP and VinM) that is within the full-scale range of ADC core circuit 90. The scaled signal is sampled by the first switched capacitor network. While sampling the scaled signal, capacitors 95 and 98 sample the reference signal, and comparator 15 in switch controller 14 determine the MSB from the sampled signal. Based on the decision of comparator 15, a proper combination of switches 80, 81, 82, and 83 closes, and one of a gain by two (2), a gain by two (2) plus Vref, and a gain by two (2) minus Vref is performed on the sampled signal to produce a first signal at output 46 of OPAMP 28. Comparator 15 determines and generates a second bit from this first signal while the second switched capacitor network samples the first signal. Based on the comparator decision for the second bit, a proper combination of switches 111, 112, 113, and 114 closes and one of the gain by two (2), gain by two (2) plus Vref, and gain by two (2) minus Vref is performed on the sampled first signal to produce a second signal at output 46 of OPAMP 28. Comparator 15 determines and generates a third bit from this second signal while the first switched capacitor network samples the second signal. Based on the comparator decision for the third bit, a proper combination of switches 80, 81, 82, and 83 closes, and one of the gain by two (2), gain by two (2) plus Vref, and gain by two (2) minus Vref is performed on the sampled second signal to produce another signal at output 46 of OPAMP 28. This process of alternating sampling between the first and second switched capacitor networks is repeated until a pre-determined number of bits is obtained.

In an exemplary embodiment, switches 78, 79, 88, and 89 of the first switched capacitor network close together during the timing phase for sampling the scaled signal supplied from scaling circuit 24 (e.g., VinP and VinM, respectively), and capacitors 93, 94, 99, and 100 capture the scaled signal. Switch controller 14 determines the MSB from the scaled signal. For example, the scaled signal is compared to pre-determined potentials (e.g., a higher potential, or a higher range of potentials, and a lower potential, or a lower range of potentials) to generate the MSB. Comparator 15 then determines a gain amount (e.g., zero volts (0V), +Vref, or −Vref) to be applied to the scaled signal to determine a more accurate digital representation the sampled analog signal. Based on the determination of the MSB by switch controller 14, a combination of switches 80, 81, 82, 83, 84, 85, 86, and 87 close together during a timing phase for sampling the reference potentials (VrefP, VrefM, and VrefMid) such that the potentials coupled to the first electrodes of capacitors 95, 98 correspond to the determined gain amount for application to the scaled signal (e.g., VinP and VinM sampled across capacitors 93, 94 and 99, 100, respectively).

After sampling the scaled signal and the reference potential, the desired gain based on the MSB determination is applied via OPAMP 28 to produce a new signal at output 46 of OPAMP 28, and the second switched capacitor network samples the new signal at output 46 of OPAMP 28. Switches 109, 110, 115, and 116 of the second switched capacitor network close while switches 101 and 103 of the first switched capacitor network close during the timing phase for sampling the output signal at output 44 of OPAMP 28, derived from the first switched capacitor network, and capacitors 120, 121, 119, and 118 capture this output signal. Comparator 15 then determines the next bit from this output signal and determines a gain amount (e.g., zero volts (0V), +Vref, or −Vref) to be applied to this output signal. Based on the determination of the next bit by switch controller 14, a combination of switches 111, 112, 113, 114, 122, and 123 close together during a timing phase for sampling the reference potentials (VrefP, VrefM, and VrefMid) such that the potentials coupled to the first electrodes of capacitors 126, 127 correspond to the determined gain amount for application to the output signal (e.g., $OUT_P$ and $OUT_M$ sampled across capacitors 120, 121 and 119, 118, respectively).

After sampling the new signal at output 46 of OPAMP 28, the desired gain based on the next bit determination is applied via OPAMP 28 to produce another new signal at output 46 of OPAMP 28, and the first switched capacitor network samples this new signal at output 46 of OPAMP 28. Switches 104 and 105 of the first switched capacitor network closes while switches 128 and 131 close during the timing phase for sampling the output signal at output 44 of OPAMP 28, derived from the second switched capacitor network, and capacitors 93, 94 and 99, 100 capture this output signal. Comparator 15 then determines the next bit from the output signal resulting from sampling by the second switched capacitor network and determines a gain amount (e.g., zero volts (0V), +Vref, or −Vref) to be applied to the output signal. Based on the determination of the next bit by switch controller 14, a combination of switches 80, 81, 82, 83, 84, 85, 86, and 87 close together during a timing phase for sampling the reference potentials (VrefP, VrefM, and VrefMid) such that the potentials coupled to the first electrodes of capacitors 95, 98 correspond to the determined gain amount for application to the output signal (e.g., $OUT_P$ and $OUT_M$ sampled across capacitors 93, 94 and 99, 100, respectively). From the foregoing sampling by the first and second switched capacitor networks, the timing of switches 104, 105, 128, and 131 for one sampling phase and of switches 101, 103, 109, 110, 115, and 116 for the other sampling phase, as well as the respective bit and gain determinations, alternate to implement a double-sampling of output 46 of OPAMP 28. This double-sampling is repeated for a pre-determined number of samples for each sample of the analog signal, and the number of samples may be adjusted for a relative minimum or maximum number of samples. After the bits are determined for the analog signal, switches 78, 79, 88, and 89 of the first switched capacitor network close together during the next timing phase for sampling the scaled analog signal supplied from scaling circuit 24 (e.g., VinP and VinM).

Figure 6:
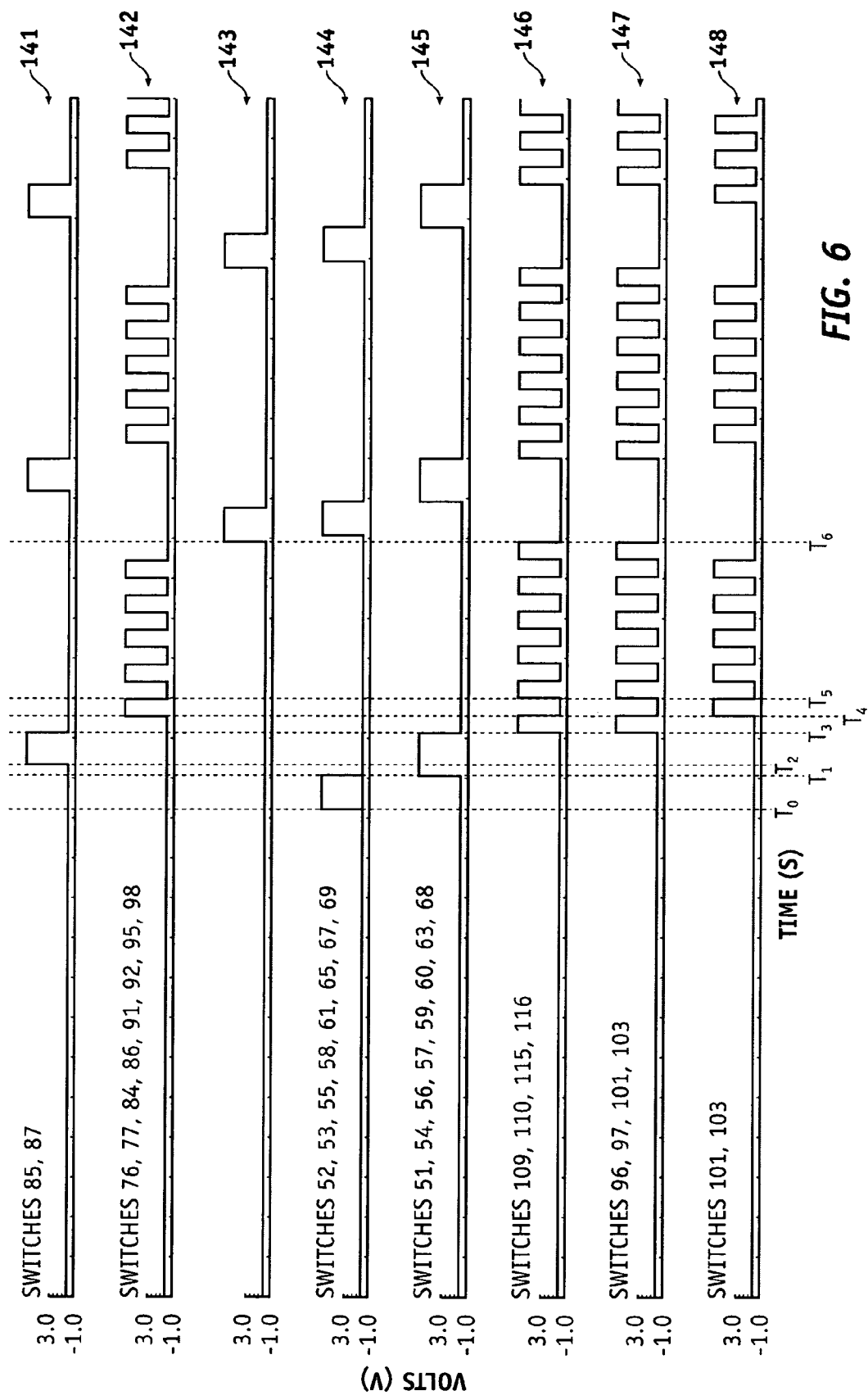
FIG. 6 is a graph illustrating a timing sequence of the converter core circuit shown in FIG. 5.

FIG. 6 is a graph illustrating a timing sequence of ADC core circuit 90 shown in FIG. 5 and scaling circuit 4 shown in FIG. 4. For each timing phase of ADC core circuit 90, the corresponding switches open in response to a low signal (e.g., about 0V) and close in response to a high signal (e.g., about 3V) over time. Initiating at a time ($T_0$), a timing phase (mux_az) 144 illustrates a timing sequence of switches 52, 53, 55, and 58 that autozeroes capacitors 70, 71, 72, and 73 and of switches 61, 65, 67, and 69 that autozeroes capacitors 74 and 75. Initiating at a time ($T_1$) subsequent to the time ($T_0$), a timing phase (mux_scale) 145 illustrates a timing sequence of switches 51, 54, 56, and 57 that samples the analog signal (e.g., Vin) across capacitors 71 and 72 and the reference potential (e.g., Vbg) across capacitors 70 and 73. The timing phase (mux_scale) 145 also illustrates a timing sequence of switches 59, 60, 63, and 68 that provides the sampled analog signal and sampled reference potential to input 44 (e.g., via $IN_P$ and $IN_M$) of OPAMP 28 for scaling while canceling an offset that may appear at input 44 of OPAMP 28. The timing phase (mux_az) 144 ends at the time ($T_1$). Initiating at a time ($T_2$), subsequent to the time ($T_1$), a timing phase (swvin) 141 illustrates a timing sequence that couples capacitors 93, 94 and 99, 100 to VinP and VinM, respectively, to sample the scaled signal. The timing phase (swvin) 141 also illustrates a timing sequence of switches 85 and 87 that couples capacitors 95 and 98 to VrefMid. Timing phase (mux_scale) 145 and timing phase (swvin) 141 both end at a time ($T_3$). Initiating at time ($T_3$), a timing phase (p1d) 146 illustrates a timing sequence of switches 109, 110, 115, and 116 that couples capacitors 120, 121, 119, and 118 with output 46 of amplifier 28. Also initiating at the time ($T_3$), a timing phase (p1d_fb) 147 illustrates a timing sequence of switches 96, 97, 101 and 103 that couples capacitors 93, 94, 95, 98, 99, 100 with input 44 of amplifier 28. Timing phases (p1d) 146 and (p1d_fb) periodically open and close switches 96, 97, 101, 103, 109, 110, 115, and 116 together for a predetermined sequence. Initiating at a time ($T_4$), a timing phase (swfb) 142 illustrates a timing sequence of switches 76, 77 and 91, 92 that couples capacitors 120, 121 and 119, 118 with residue potentials VrsdP and VrsdM, respectively. Timing phase (swfb) 142 also illustrates a timing sequence of switches 84 and 86 that couple capacitors 95 and 98 to VrefMid. Also initiating at the time ($T_4$), a timing phase (p2d) 148 illustrates a timing sequence of switches 103 and 101 that couples capacitors 93, 94, 95, 98, 99, 100 with input 44 of amplifier 28. Timing phases (swfb) 142 and (p2d) 148 periodically open and close switches 84, 86, 101, and 103 together for a predetermined sequence. Timing phases (swfb) 142 and (p2d) 148 alternate with timing phases (p1d) 146 and (p1d_fb) 147. For example, at time ($T_5$), timing phases (p1d) 146 and (p1d_fb) 147 illustrate that switches 96, 97, 101, 103, 109, 110, 115, and 116 close together again for sampling of output 46 of OPAMP 28 by capacitors 120, 121, 119, and 118. Initiating at a time ($T_6$), a timing phase (eoc) 143 illustrates a timing sequence that indicates an end of conversion for a particular sampled analog signal. Timing phases (swfb) 142, (p1d) 146, (p1d_fb) 147, and (p2d) 148 end at time ($T_6$).

Figure 7:
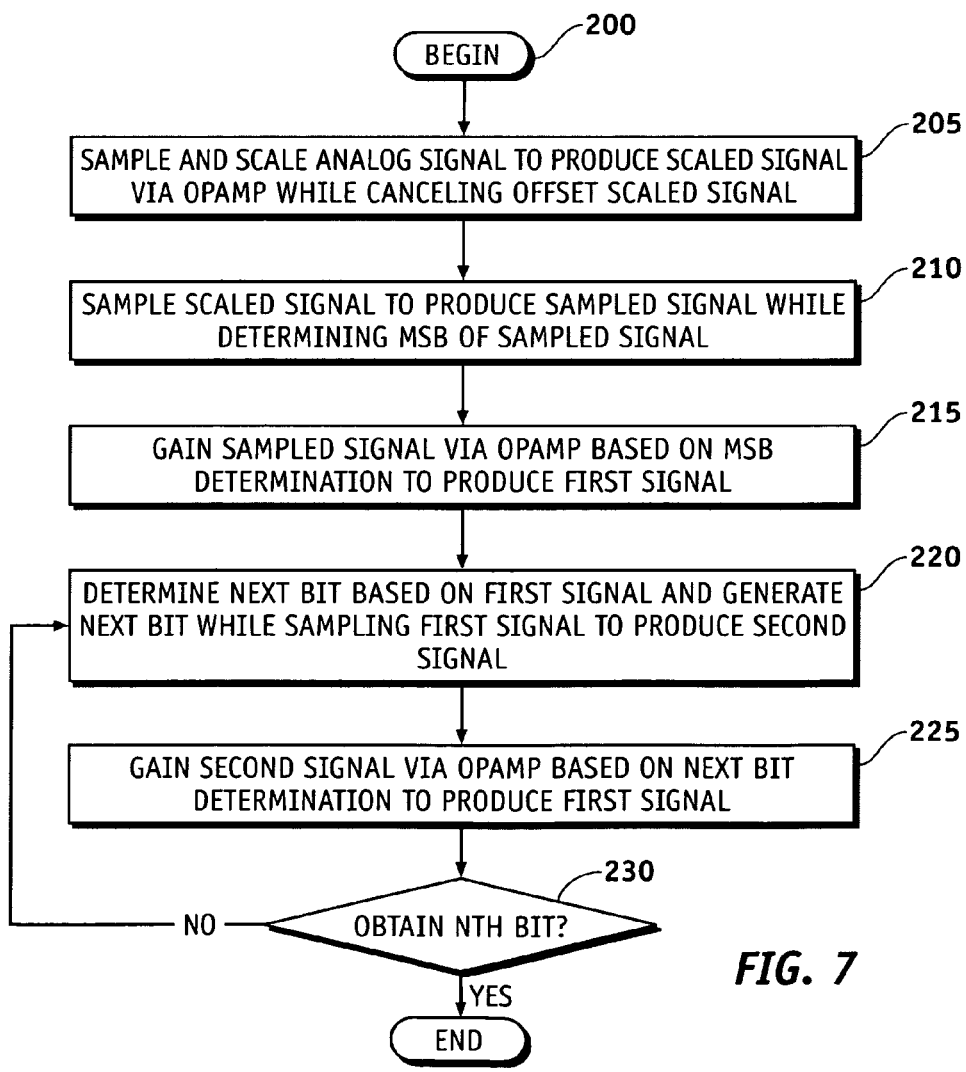
FIG. 7 is a flow diagram of a method for converting an analog signal to a digital signal in accordance with an exemplary embodiment of the present invention.

FIG. 7 is a flow diagram of a method 200 for converting an analog signal to a digital signal in accordance with an exemplary embodiment of the present invention. The analog signal is sampled and scaled to produce a scaled signal via a single OPAMP while canceling an offset of the scaled signal at step 205. The scaled signal is sampled to produce a sampled signal while determining the MSB of the sampled signal at step 210. Additionally, a reference signal is sampled to produce a first gain potential based on the MSB. The sampled signal is gained via the OPAMP, based on the MSB determination, to produce a first signal at step 215. A next bit is determined based on the first signal, and the next bit is generated while sampling the first signal to produce a second signal at step 220. A predetermined number (n) of subsequent bits is preferably determined from the second signal, and an inquiry is made to determine if the nth bit has been obtained at step 230. When the nth bit has not been obtained, the next bit is determined at step 220. When the n- the bit has been obtained, the method ends for this sample of the analog signal. In an exemplary embodiment, one of the second signal and a third signal are sampled to produce a second sampled signal while determining a first subsequent bit of the predetermined number of subsequent bits and sampling the reference signal to produce a second gain. The second gain is based on the first subsequent bit determination. The second gain is applied to the second sampled signal via the OPAMP to produce a fourth signal. The fourth signal is sampled to produce a third sampled signal while determining a second subsequent bit of the predetermined number of subsequent bits and sampling the reference signal to produce a third gain. The third gain is based on the second subsequent bit. The third gain is applied to the third sampled signal via the OPAMP to produce the third signal. The first, second, and third gains may be selected from one of a gain by two (2), a gain by two (2) plus a predetermined potential, and a gain by two (2) minus the predetermined potential. In another exemplary embodiment, at least one third signal is double-sampled, the third signal being derived from the second signal. The method may further comprise generating the reference signal via the OPAMP while canceling an offset in the reference signal.

A system for converting an analog signal to a digital signal is provided comprising an amplifier, a first circuit coupled to said amplifier, and a second circuit having an input configured to receive the analog signal, a first output coupled to the input of the first circuit, and a second output coupled to the amplifier. The first circuit has a signal range and an input configured to receive a first signal. The first circuit is configured to sample the first signal and further configured to produce the digital signal from the first signal via the amplifier. The second circuit is configured to sample and scale the analog signal via the amplifier to produce the first signal within the signal range and further configured to cancel an offset of said first signal. The first circuit is further configured to produce at least one sampled signal from the first signal, sample a reference potential while producing the at least one sampled signal, and apply a gain to the at least one sampled signal via the amplifier. The gain based on the reference potential. The first circuit comprises a gain two plus/minus reference potential circuit. In one exemplary embodiment, the amplifier has an input and an output, and the first circuit comprises first and second switched capacitor networks. The first switched capacitor network has first and second inputs and has an output coupled to the input of the amplifier. The first input of the first switched capacitor network is coupled to the input of the first circuit and the output of the amplifier, and the second input of the first switched capacitor network is configured to receive a first reference potential. The first switched capacitor network is configured to sample one of the first signal and a second signal at the first input of the first switched capacitor network and further configured to produce, via the amplifier, a third signal from a first combination of the first reference potential and one of the first and second signals. The second switched capacitor network has first and second inputs and has an output coupled to the input of the amplifier. The first input of the second switched capacitor network is coupled to the output of the amplifier, and the second input of the second, switched capacitor network is configured to receive a second reference potential. The second switched capacitor network is configured to sample the third signal and further configured to produce, via the amplifier, the second signal from a second combination of the second reference potential and the third signal. The system may further comprise a controller coupled to the first and second circuits. The controller is configured to transmit a first control signal to the second circuit to produce the first signal and transmit a second control signal to the first circuit to sample at least one derivative signal based on the first signal. In another exemplary embodiment, the amplifier has an input and an output, and the first circuit comprises first, second, third, and fourth switched capacitor networks. The first switched capacitor network has an input and has an output coupled to the input of the amplifier. The input of the first switched capacitor network is coupled to the input of the first circuit and the output of the amplifier. The first switched capacitor network is configured to sample one of the first signal and a second signal and is further configured to produce, via the amplifier, a third signal from a first combination of a first gain potential and one of the first and second signals. The second switched capacitor network has an input coupled to a first reference potential and has an output coupled to the output of the first switched capacitor network. The second switched capacitor network is configured to sample the first reference potential to produce the first gain potential. The third switched capacitor network has first and second inputs and has an output coupled to the input of the amplifier. The first input of the third switched capacitor network is coupled to the output of the amplifier, and the second input of the third switched capacitor network is coupled to the input of the first switched capacitor network. The second switched capacitor network is configured to sample the third signal and is further configured to produce, via the amplifier, the second signal from a second combination of the third signal and a second gain potential. The fourth switched capacitor network has an input coupled to a second reference potential and has an output coupled to the output of the third switched capacitor network. The fourth switched capacitor network is configured to sample the second reference potential to produce the second gain potential. In this exemplary embodiment, the system may further comprise a comparator coupled to the first circuit. The comparator is configured to determine an MSB from the first signal, transmit a first control signal to the second switched capacitor network to produce the first gain potential when the first switched capacitor network samples the first signal, perform a first comparison of the third signal with a first predetermined value, transmit a second control signal to the fourth switched capacitor network to produce the second gain potential when the third switched capacitor network samples the third signal, perform a second comparison of the second signal with a second predetermined value, and transmit a third control signal to the second switched capacitor network to produce the first gain potential when the first switch capacitor network samples the second signal. The first control signal based on the MSB. The second control signal is based on the first comparison. The third control signal is based on the second comparison. Each of the first and second gain potentials represents one of a gain by two, a gain by two plus a predetermined potential, and a gain by two minus a predetermined potential.

A system for converting an analog signal to a digital signal is provided comprising first, second, and third circuits. The first circuit has a first input configured to receive a first signal having a signal range and has a second input configured to receive a reference signal. The first circuit comprises an amplifier having an input and an output. The first circuit is configured to produce the digital signal from the first signal and the reference signal. The second circuit has a first input configured to couple to a first reference potential, a second input coupled to the output of the amplifier, a first output coupled to the second input of the first circuit, and a second output coupled to the input of the amplifier. The second circuit is configured to produce the reference signal via the amplifier from the first reference potential while canceling an offset of the reference signal. The third circuit has an input configured to receive the analog signal, a first output coupled to the first input of the first circuit, and a second output coupled to the input of the amplifier. The second circuit is configured to sample and scale the analog signal via the amplifier to produce the first signal within the signal range while canceling an offset of the first signal. The system may further comprise a controller coupled to the first, second, and third circuits. The controller is configured to transmit a first control signal to the third circuit to produce the first signal, transmit a second control signal to the second circuit to produce the reference signal, and transmit a third control signal to the first circuit to sample the first signal while the second circuit produces the reference signal. The first circuit comprises a first switched capacitor network having first and second inputs and having an output coupled to the input of the amplifier, and a second switched capacitor network having first and second inputs and having an output coupled to the input of the amplifier. The first input of the first switched capacitor network is coupled to the first input of the first circuit and the output of the amplifier, and the second input of the first switched capacitor network is coupled to the second input of the first circuit. The first switched capacitor network is configured to sample one of the first signal and a second signal at the first input of the first switched capacitor network and is further configured to produce, via the amplifier, a third signal from a first combination of the reference signal and one of the first and second signals. The first input of the second switched capacitor network is coupled to the output of the amplifier, the second input of the second switched capacitor network is coupled to the second input of the first circuit. The second switched capacitor network is configured to sample the third signal and further configured to produce, via the amplifier, the second signal from a second combination of the reference signal and the third signal. The system may further comprise a comparator coupled to the first circuit. The comparator is configured to perform a first comparison with a sample of the first signal to determine an MSB, transmit a first control signal to the first switched capacitor network, perform a second comparison with a sample of the third signal to determine a first subsequent bit, transmit a second control signal to the second switched capacitor network, perform a third comparison with a sample of the second signal to determine a second subsequent bit, and transmit a third control signal to the first switched capacitor network to apply a third gain to the sample of the second signal. The first control signal directs the first switched capacitor network to apply a first gain to the sample of the first signal. The first gain is derived from the reference signal and based on the first comparison. The second control signal directs the second switched capacitor network to apply a second gain to the sample of the third signal. The second gain is derived from the reference signal and based on the second comparison. The third gain is derived from the reference signal and based on the third comparison. The third circuit comprises first and second switched capacitor networks. The first switched capacitor network has an input coupled to the input of the third circuit and to a second reference potential and has an output coupled to the input of the amplifier. The first switched capacitor network is configured to produce a sampled signal from the analog signal and scale the sampled signal to produce the first signal. The second switched capacitor network has an input coupled to the input of the amplifier and has an output coupled to the output of the amplifier. The second switched capacitor network is configured to cancel offset of the first signal.

A method for converting an analog signal to a digital signal is provided comprising the steps of sampling and scaling the analog signal via an OPAMP to produce a first signal while canceling an offset of the first signal, the offset produced by the OPAMP, and determining one or more bits by deriving one or more sampled signals from the first signal while applying a corresponding gain via the OPAMP to each of the one or more sampled signals. The corresponding gain based on a corresponding bit of the one or more bits. the method may further comprise sampling the first signal to produce a first sampled signal while determining an MSB of the first sampled signal and sampling a reference signal to produce a first gain, and applying the first gain to the first sampled signal via the OPAMP to produce a second signal. The first gain is based on the MSB. The determining step comprises sampling the second signal to produce a second sampled signal while determining a first subsequent bit of the predetermined number of subsequent bits and sampling the reference signal to produce a second gain, applying the second gain to the second sampled signal via the OPAMP to produce a third signal, sampling the third signal to produce a third sampled signal while determining a second subsequent bit of the predetermined number of subsequent bits and sampling the reference signal to produce a third gain, and applying the third gain to the third sampled signal via the OPAMP to produce a fourth signal. The second gain is based on the first subsequent bit. The third gain is based on the second subsequent bit. The method may further comprise the step of generating a reference signal via the OPAMP while canceling an offset in the reference signal, produced by the OPAMP, and producing the corresponding gain from the reference signal. The step of sampling the first signal comprises selecting the first gain from one of a group consisting of a gain by two, a gain by two plus a predetermined potential, and a gain by two minus a predetermined potential. Each of the step of sampling the second signal and the step of sampling the third signal comprises selecting each of the second and third gains from one of the group consisting of a gain by two, a gain by two plus a predetermined potential, and a gain by two minus the predetermined potential. The step of determining comprises double-sampling a second signal, the second signal derived from the first signal. The step of sampling comprises sampling a reference potential and supplying a combination of a sample of the analog signal with the reference potential to the OPAMP. The step of determining comprises determining a first bit of the one or more bits based on a first sampled signal of the one or more sampled signals, determining a first potential based on the first bit of the one or more bits, and supplying a combination of the first sampled signal of the one or more sampled signals with the first potential to the OPAMP. The corresponding gain is based on the combination of the first sampled signal of the one or more sampled signals with the first potential to the OPAMP.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A system for converting an analog signal to a digital signal, the system comprising:
   an amplifier;
   a first circuit coupled to said amplifier, said first circuit having a signal range and having an input configured to receive a first signal, said first circuit configured to sample said first signal and further configured to produce the digital signal from the first signal via said amplifier; and
   a second circuit having an input and first and second outputs, said input of said second circuit configured to receive the analog signal, said first output of said second circuit coupled to said input of said first circuit, said second output of said second circuit coupled to said amplifier, said second circuit configured to:
      sample and scale the analog signal via said amplifier to produce said first signal within said signal range; and
      cancel an offset of said first signal.

2. A system according to claim 1, wherein said first circuit is further configured to:
   produce at least one sampled signal from said first signal;
   sample a reference potential while producing said at least one sampled signal; and
   apply a gain to said at least one sampled signal via said amplifier, said gain based on said reference potential.

3. A system according to claim 1, wherein said first circuit comprises a gain two plus/minus reference potential circuit.

4. A system according to claim 1, wherein said amplifier has an input and an output, and wherein said first circuit comprises:
   a first switched capacitor network having first and second inputs and having an output coupled to said input of said amplifier, said first input of said first switched capacitor network coupled to said input of said first circuit and said output of said amplifier, said second input of said first switched capacitor network configured to receive a first reference potential, said first switched capacitor network configured to sample one of said first signal and a second signal at said first input of said first switched capacitor network and further configured to produce via said amplifier a third signal from a first combination of said first reference potential and one of said first and second signals; and
   a second switched capacitor network having first and second inputs and having an output coupled to said input of said amplifier, said first input of said second switched capacitor network coupled to said output of said amplifier, said second input of said second switched capacitor network configured to receive a second reference potential, said second switched capacitor network configured to sample said third signal and further configured to produce via said amplifier said second signal from a second combination of said second reference potential and said third signal.

5. A system according to claim 1 further comprising a controller coupled to said first and second circuits, said controller configured to:
   transmit a first control signal to said second circuit to produce said first signal; and
   transmit a second control signal to said first circuit to sample at least one derivative signal based on said first signal.

6. A system according to claim 1, wherein said amplifier has an input and an output, and wherein said first circuit comprises:
   a first switched capacitor network having an input and having an output coupled to said input of said amplifier, said input of said first switched capacitor network coupled to said input of said first circuit and said output of said amplifier, said first switched capacitor network configured to sample one of said first signal and a second signal and further configured to produce via said amplifier a third signal from a first combination of a first gain potential and one of said first and second signals;
   a second switched capacitor network having an input coupled to a first reference potential and having an output coupled to said output of said first switched capacitor network, said second switched capacitor network configured to sample said first reference potential to produce said first gain potential;
   a third switched capacitor network having first and second inputs and having an output coupled to said input of said amplifier, said first input of said third switched capacitor network coupled to said output of said amplifier, said second input of said third switched capacitor network coupled to said input of said first switched capacitor network, said second switched capacitor network configured to sample said third signal and further configured to produce via said amplifier said second signal from a second combination of said third signal and a second gain potential; and
   a fourth switched capacitor network having an input coupled to a second reference potential and having an output coupled to said output of said third switched capacitor network, said fourth switched capacitor network configured to sample said second reference potential to produce said second gain potential.

7. A system according to claim 6 further comprising a comparator coupled to said first circuit, said comparator configured to:
   determine a most significant bit (MSB) from said first signal;
   transmit a first control signal to said second switched capacitor network to produce said first gain potential when said first switched capacitor network samples said first signal, said first control signal based on said MSB;
   perform a first comparison of said third signal with a first predetermined value;
   transmit a second control signal to said fourth switched capacitor network to produce said second gain potential when said third switched capacitor network samples said third signal, said second control signal based on said first comparison;
   perform a second comparison of said second signal with a second predetermined value; and transmit a third control signal to said second switched capacitor network to produce said first gain potential when said first switch capacitor network samples said second signal, said third control signal based on said second comparison, each of said first and second gain potentials representing one of a gain by two, a gain by two plus a predetermined potential, and a gain by two minus a predetermined potential.

8. A system for converting an analog signal to a digital signal, the system comprising:
 a first circuit having a first input configured to receive a first signal and having a second input configured to receive a reference signal, said first signal having a signal range, said first circuit comprising an amplifier having an input and an output, said first circuit configured to produce the digital signal from said first signal and said reference signal;
 a second circuit having first and second inputs and first and second outputs, said first input of said second circuit configured to couple to a first reference potential, said second input of said second circuit coupled to said output of said amplifier, said first output of said second circuit coupled to said second input of said first circuit, said second output of said second circuit coupled to said input of said amplifier, said second circuit configured to produce said reference signal via said amplifier from said first reference potential while canceling an offset of said reference signal; and
 a third circuit having an input and first and second outputs, said input of said third circuit configured to receive the analog signal, said first output of said third circuit coupled to said first input of said first circuit, said second output of said third circuit coupled to said input of said amplifier, said second circuit configured to sample and scale the analog signal via said amplifier to produce said first signal within said signal range while canceling an offset of said first signal.

9. A system according to claim 8 further comprising a controller coupled to said first, second, and third circuits and configured to:
 transmit a first control signal to said third circuit to produce said first signal;
 transmit a second control signal to said second circuit to produce said reference signal; and
 transmit a third control signal to said first circuit to sample said first signal while said second circuit produces said reference signal.

10. A system according to claim 8, wherein said first circuit comprises:
 a first switched capacitor network having first and second inputs and having an output coupled to said input of said amplifier, said first input of said first switched capacitor network coupled to said first input of said first circuit and said output of said amplifier, said second input of said first switched capacitor network coupled to said second input of said first circuit, said first switched capacitor network configured to sample one of said first signal and a second signal at said first input of said first switched capacitor network and further configured to produce via said amplifier a third signal from a first combination of said reference signal and one of said first and second signals; and
 a second switched capacitor network having first and second inputs and having an output coupled to said input of said amplifier, said first input of said second switched capacitor network coupled to said output of said amplifier, said second input of said second switched capacitor network coupled to said second input of said first circuit, said second switched capacitor network configured to sample said third signal and further configured to produce via said amplifier said second signal from a second combination of said reference signal and said third signal.

11. A system according to claim 10 further comprising a comparator coupled to said first circuit, said comparator configured to:
 perform a first comparison with a sample of said first signal to determine an MSB;
 transmit a first control signal to said first switched capacitor network, said first control signal directing said first switched capacitor network to apply a first gain to said sample of said first signal, said first gain derived from said reference signal and based on said first comparison;
 perform a second comparison with a sample of said third signal to determine a first subsequent bit;
 transmit a second control signal to said second switched capacitor network, said second control signal directing said second switched capacitor network to apply a second gain to said sample of said third signal, said second gain derived from said reference signal and based on said second comparison;
 perform a third comparison with a sample of said second signal to determine a second subsequent bit; and
 transmit a third control signal to said first switched capacitor network to apply a third gain to said sample of said second signal, said third gain derived from said reference signal and based on said third comparison.

12. A system according to claim 8, wherein said third circuit comprises:
 a first switched capacitor network having an input coupled to said input of said third circuit and to a second reference potential and having an output coupled to said input of said amplifier, said first switched capacitor network configured to:
  produce a sampled signal from the analog signal; and
  scale said sampled signal to produce said first signal; and
 a second switched capacitor network having an input coupled to said input of said amplifier and having an output coupled to said output of said amplifier, said second switched capacitor network configured to cancel offset of said first signal.

13. A method for converting an analog signal to a digital signal, the method comprising the steps of:
 sampling and scaling the analog signal via an OPAMP to produce a first signal while canceling an offset of the first signal, the offset produced by the OPAMP; and
 determining one or more bits of the digital signal by deriving one or more sampled signals from the first signal while applying a corresponding gain via the OPAMP to each of the one or more sampled signals, the corresponding gain based on a corresponding bit of the one or more bits of the digital signal.

14. A method according to claim 13, wherein said step of determining comprises:
 sampling the first signal to produce a first sampled signal and determining an MSB of the first sampled signal while sampling a reference signal to produce a first gain, the first gain based on the MSB; and
 applying the first gain to the first sampled signal via the OPAMP to produce a second signal.

15. A method according to claim 14, wherein said determining step comprises:

sampling the second signal to produce a second sampled signal while determining a first subsequent bit of the predetermined number of subsequent bits and sampling the reference signal to produce a second gain, the second gain based on the first subsequent bit;

applying the second gain to the second sampled signal via the OPAMP to produce a third signal;

sampling the third signal to produce a third sampled signal while determining a second subsequent bit of the predetermined number of subsequent bits and sampling the reference signal to produce a third gain, the third gain based on the second subsequent bit; and applying the third gain to the third sampled signal via the OPAMP to produce a fourth signal.

16. A method according to claim 15, wherein said step of sampling the first signal comprises selecting the first gain from one of a group consisting of a gain by two, a gain by two plus a predetermined potential, and a gain by two minus a predetermined potential; and wherein each of said step of sampling the second signal and said step of sampling the third signal comprises selecting each of the second and third gains from one of the group consisting of a gain by two, a gain by two plus a predetermined potential, and a gain by two minus the predetermined potential.

17. A method according to claim 13 further comprising:

generating a reference signal via the OPAMP while canceling an offset in the reference signal produced by the OPAMP; and producing the corresponding gain from the reference signal.

18. A method according to claim 13, wherein said step of determining comprises double-sampling at least one second signal, the at least one second signal derived from the first signal.

19. A method according to claim 13, wherein said step of sampling comprises:

sampling a reference potential; and supplying a combination of a sample of the analog signal with the reference potential to the OPAMP.

20. A method according to claim 13, wherein said step of determining comprises:

determining a first bit of the one or more bits based on a first sampled signal of the one or more sampled signals;

determining a first potential based on the first bit of the one or more bits; and supplying a combination of the first sampled signal of the one or more sampled signals with the first potential to the OPAMP, the corresponding gain based on the combination of the first sampled signal of the one or more sampled signals with the first potential to the OPAMP.

* * * * *